(12) United States Patent
Mei et al.

(10) Patent No.: US 9,035,715 B2
(45) Date of Patent: May 19, 2015

(54) COMPACT BROADBAND IMPEDANCE TRANSFORMER

(71) Applicant: Anaren, Inc., East Syracuse, NY (US)

(72) Inventors: Chong Mei, Jamesville, NY (US); Ying Huang, East Syracuse, NY (US)

(73) Assignee: Anaren, Inc., East Syracuse, NY (US)

( * ) Notice: Subject to any disclaimer, the term of this patent is extended or adjusted under 35 U.S.C. 154(b) by 266 days.

(21) Appl. No.: 13/782,279

(22) Filed: Mar. 1, 2013

(65) Prior Publication Data

US 2014/0118071 A1    May 1, 2014

Related U.S. Application Data

(60) Provisional application No. 61/718,473, filed on Oct. 25, 2012.

(51) Int. Cl.
| | |
|---|---|
| *H03H 7/38* | (2006.01) |
| *H03F 1/02* | (2006.01) |
| *H03F 1/56* | (2006.01) |
| *H03F 3/60* | (2006.01) |
| *H01P 5/18* | (2006.01) |

(52) U.S. Cl.
CPC ............... *H03F 1/0288* (2013.01); *H03H 7/38* (2013.01); *H03F 1/56* (2013.01); *H03F 3/60* (2013.01); *H03F 2200/222* (2013.01); *H03F 2200/387* (2013.01); *H01P 5/187* (2013.01)

(58) Field of Classification Search
USPC ................................. 333/33, 32, 24 R, 25, 26
See application file for complete search history.

(56) References Cited

U.S. PATENT DOCUMENTS 6,407,647 B1 *   6/2002   Apel et al. ..................... 333/25

* cited by examiner

*Primary Examiner* — Stephen E Jones
(74) *Attorney, Agent, or Firm* — Daniel P Malley; George R. McGuire; Bond Schoeneck & King, PLLC

(57) ABSTRACT

The present invention is directed to an impedance transformation device for use in a system having a characteristic system impedance, the device being characterized by a predetermined bandwidth having a center frequency. The device housing size is one-eighth wavelength of the center frequency. A first coupler is characterized by an even mode impedance and an odd mode impedance. The bandwidth is a function of the even mode impedance and the odd mode impedance substantially corresponds to the component port impedance. At least one second coupler is disposed in parallel with the first coupler and is characterized by the even mode impedance and the odd mode impedance.

29 Claims, 11 Drawing Sheets

| PIN | DESIGNATION |
|-----|-------------|
| 1 | 50ohm port |
| 2 | GND |
| 3 | GND |
| 4 | 12.5ohm port |
| 5 | GND |
| 6 | NC |

COMPACT BROADBAND IMPEDANCE TRANSFORMER

CROSS-REFERENCE TO RELATED APPLICATIONS

This is application claims priority to U.S. Provisional Patent Application Ser. No. 61/718,473 filed on Oct. 25, 2012, the content of which is relied upon and incorporated herein by reference in its entirety, and the benefit of priority under 35 U.S.C. §119(e) is hereby claimed.

BACKGROUND OF THE INVENTION

1. Field of the Invention

The present invention relates generally to RF devices, and particularly to impedance transforming network.

2. Technical Background

Impedance matching is an important aspect in the design of microwave and millimeter wave circuits. A good impedance match ensures an efficient transfer of power from the source to the load. Conversely, a mismatch between the load and source results in reflections that degrade the system signal to noise ratio (SNR) and causes the sensitivity of the device to deteriorate. The reflections generate a standing wave along the transmission line. Standing waves are problematic in high power applications because they lead to relatively high currents at certain spots along the transmission line. As those skilled in the art will appreciate, the current is dissipated as heat in accordance with the relationship $I^2 R$, where I is the current and R is the resistance of the transmission line. The extraordinary heat created at these so-called "hot spots" becomes a reliability issue since the overheating reduces the life time of the device. Briefly stated, a good impedance match ensures the signal power is transmitted to the RF load instead of being dissipated as heat.

Providing an impedance match at a single frequency is conventional and not difficult. On the other hand, achieving a good impedance match over a wide frequency band is usually challenging. And this is exactly what is needed. The modern communication system continues to evolve into one that demands ever increasing bandwidths. Thus, the need for an impedance matching solution for wide band applications is more critical than ever. In particular, the optimum matching impedance of a RF power transistor is fairly low in power amplifier designs. For example, in the LTE bands of 700 to 2700 MHz a matching network configured to transform a low RF transistor impedance to the system impedance is usually a design challenge.

In one approach, wideband matching using a lumped element network has been considered. However, tolerance variations and parasitic effects of the lumped element components make unfeasible for high frequency designs.

At high frequencies, distributed transmission line matching circuits are generally the preferred approach. In this type of solution, the common technique is to employ multiple sections of quarter wavelength transmission line or stepped impedance transformers that have certain impedance profiles along the line. Referring to FIG. 1, for example, a schematic diagram of a conventional four-section Chebyshev impedance transformer is shown. The Chebyshev impedance transformer uses four sections of quarter wavelength transmission lines to convert a high impedance of Zs to low impedance of Zs/4. The impedances for each stage are shown in the FIG. 1. Without loss of generality, the center frequency is chosen as 1.75 GHz and the high impedance Zs is chosen as 50 ohm The total size of the Chebyshev transformer is one wavelength at the center frequency. Unfortunately, the improvement in bandwidth of these transformers is outweighed by the substantial physical size of these circuits, thus generally leading to higher loss. Stated differently, bulky solutions are not compatible with the current miniaturization trend in the wireless communications industry.

In yet another approach, a matching arrangement that includes a plurality of coaxial transmission lines has been considered. In this arrangement, each transmission line is wound around a ferrite toroid for a predetermined number of turns, or inserted into ferrite sleeves to achieve wideband impedance match. There are, however, drawbacks associated with this approach. Like the distributed transmission line approach, the use of coaxial transmission lines is a bulky solution that is not favored for the aforementioned reasons. Moreover, the ferrites exhibit a limited operating frequency band due to increased losses at high frequencies.

What is needed, therefore, is a relatively compact wideband impedance transformer that substantially overcomes the drawbacks articulated above. A compact wideband impedance transformer is needed that does not, for example, employ ferrites or other bulky features.

SUMMARY OF THE INVENTION

The present invention addresses the needs described above by providing a compact wideband impedance transformer that substantially overcomes the drawbacks articulated above. The present invention provides a broadband impedance transformer that is adapted to be set forth in a compact planar structure. The present invention provides a broadband impedance transformer that is free of the ferrite elements, and implemented in a compact surface mount package using planar stripline structure.

One aspect of the present invention is directed to an impedance transformation device for use in a system having a characteristic system impedance, the device being characterized by a predetermined bandwidth having a center frequency. The device includes a housing having an interior region characterized by a size substantially corresponding to a one-eighth wavelength of the center frequency. The housing includes a plurality of input/output (I/O) ports, the plurality of I/O ports including a first port configured to be coupled to a system component characterized by a component port impedance, and a second port configured to be coupled to the system impedance, an impedance transformation ratio of the component port impedance and the system impedance. A first coupler is disposed in the interior region and includes a first transmission line and a second transmission line. The first transmission line is coupled between the first port and the second port. The first transmission line and the second transmission line have a predetermined geometry disposed in a stripline broadside arrangement. The first coupler is characterized by an even mode impedance and an odd mode impedance. The bandwidth is a function of the even mode impedance and the odd mode impedance substantially corresponds to the component port impedance. At least one second coupler is disposed in the interior region substantially in parallel with the first coupler. The at least one second coupler includes a third transmission line and a fourth transmission line having the predetermined geometry disposed in the stripline broadside arrangement, the at least one second coupler being characterized by the even mode impedance and the odd mode impedance.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 1:
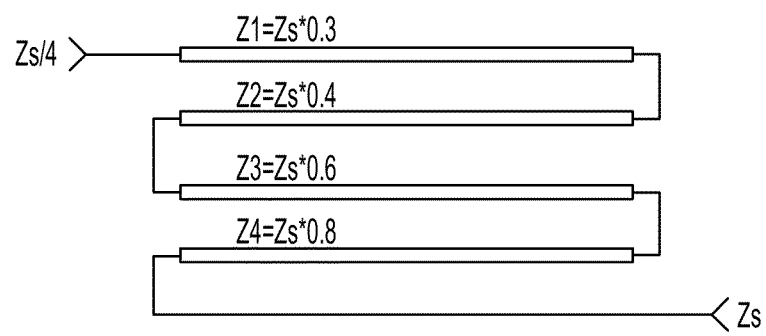
FIG. 1 is a schematic diagram of a conventional four-section Chebyshev impedance transformer.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the broadband impedance transformer of the present invention is shown in FIG. 2, and is designated generally throughout by reference numeral 10.

Figure 2:
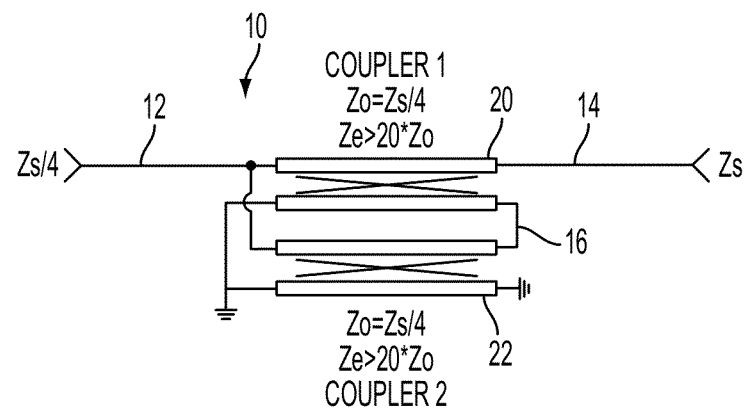
FIG. 2 is a schematic diagram of a broadband impedance transformer in accordance with one embodiment of the present invention.

As embodied herein and depicted in FIG. 2, a schematic diagram of a broadband impedance transformer 10 in accordance with one embodiment of the present invention is disclosed. The impedance transformer 10 includes two identical coupler elements 20, 22. Coupler 20 is connected in parallel with coupler 22 at low impedance port 12. The couplers 20, 22 are coupled in series at high impedance port 14. As described in detail below, each coupler is implemented as a planar stripline broadside coupler laid out in a spiral pattern. Moreover, each of the couplers includes four inter-digitally connected traces vertically aligned and spaced apart by relatively thin dielectric layers. This configuration makes it possible to achieve required high even mode impedance while maintaining desired odd mode impedance without the help of ferrites. The circuit arrangement depicted in FIG. 2 is implemented in a standard SMT 0805 package.

The compact arrangement of FIG. 2 achieves the impedance transformation from Zs to Zs/4. In particular, the odd mode impedances of each coupler 20, 22 are equal to the low impedance specified by the design requirement. The even mode impedances of the couplers 20, 22 are used to adjust the bandwidth as required by the design specification. The electrical length of each coupler is 45° at the targeted frequency band center (e.g., 1750 MHz). Note that the total size of the impedance transformer 10 realized using the arrangement depicted in FIG. 2 is a half wavelength at the center frequency. Note that the size of the conventional Chebyshev transformer depicted in FIG. 1 is one wavelength at the center frequency. Thus, the present invention represents a 50% reduction for the total transmission line length over the conventional device depicted in FIG. 1.

Figure 3:
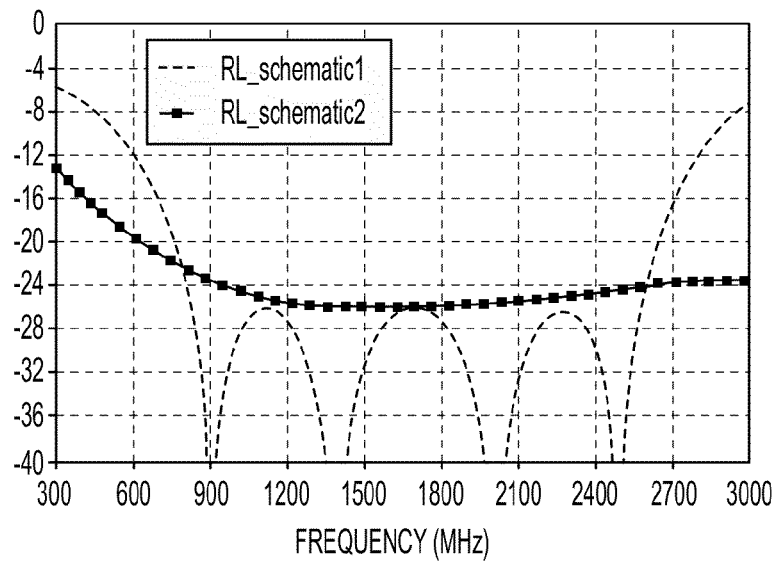
FIG. 3 is a plot of the return loss (RL) versus frequency.

From a performance standpoint, FIG. 3 is a graphical illustration of the Return loss (RL) versus frequency for different schematics shown in FIG. 1 and FIG. 2. The dashed curve displays the RL for FIG. 1, whereas the solid curve with the squares shows the RL for FIG. 2. As shown, the four-section Chebyshev transformer provides better than −20 dB RL in the band of 750-2625 MHz. The broadband coupler of the present invention, on the other hand, provides superior performance. It exhibits a greater than −20 dB RL result in a bandwidth from 600 MHz onward. Stated briefly, when compared to the conventional approach of FIG. 1, the present invention exhibits a wider relative bandwidth at half of the total electrical length.

Figure 4:
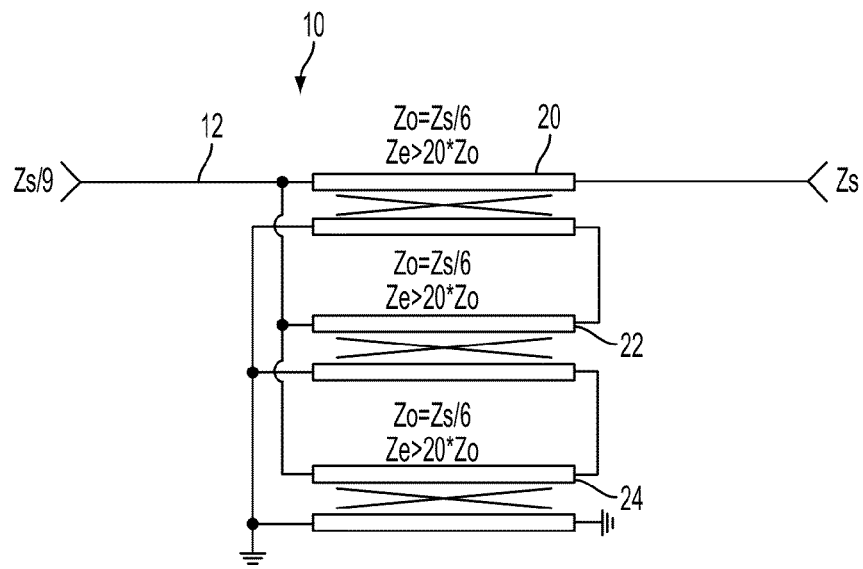
FIG. 4 is a schematic diagram of a impedance transformer in accordance with another embodiment of the present invention.

Referring to FIG. 4, a schematic diagram of a impedance transformer 10 in accordance with another embodiment of the present invention is disclosed. In this embodiment, the impedance transformer 10 is configured to achieve an impedance transforming ratio of nine (9). Impedance transformer 10 includes three identical coupler elements 20, 22 and 24 that are interconnected in the manner shown. Again, each coupler is implemented as a planar stripline broadside coupler with a spiral layout, and each of the couplers includes four inter-digitally connected traces vertically aligned and spaced by relatively thin dielectric layers. This broadband impedance transformer can operate in the full LTE band of 700 MHz to 2700 MHz and, as before, employs planar PCB technology. This embodiment may be implemented in a standard 0805 package as described herein.

Figures 5A, 5B, 6:
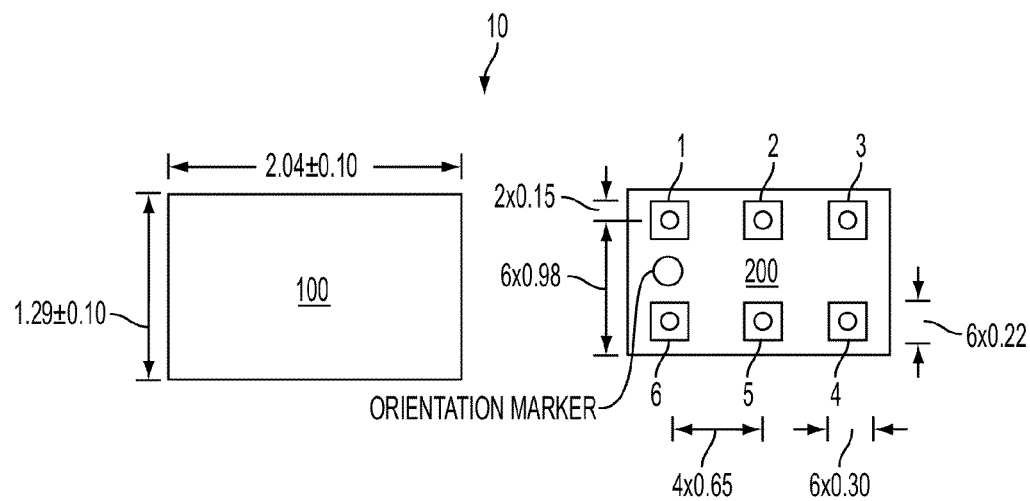
FIGS. 5A and 5B are plan views of a broad band impedance transformer integrated circuit in accordance with another embodiment of the present invention.
FIG. 6 is a table showing pin designations for the integrated circuit depicted in FIGS. 2 and 5.

In reference to FIGS. 5A and 5B, plan views of a broad band coupler integrated circuit 10 in accordance with an embodiment of the present invention. FIG. 5A shows the top view of the integrated circuit package 100, whereas FIG. 5B shows the bottom view. The bottom view clearly shows the various pin in accordance with a standard SMT 0805 package. Stated differently, the present invention provides superior performance in a compact package. Referring to FIG. 6, a table showing pin designations for the integrated circuit depicted in, for example, FIG. 2 is disclosed. The embodiment of FIG. 4 may also be implemented using this IC package.

Figure 7:
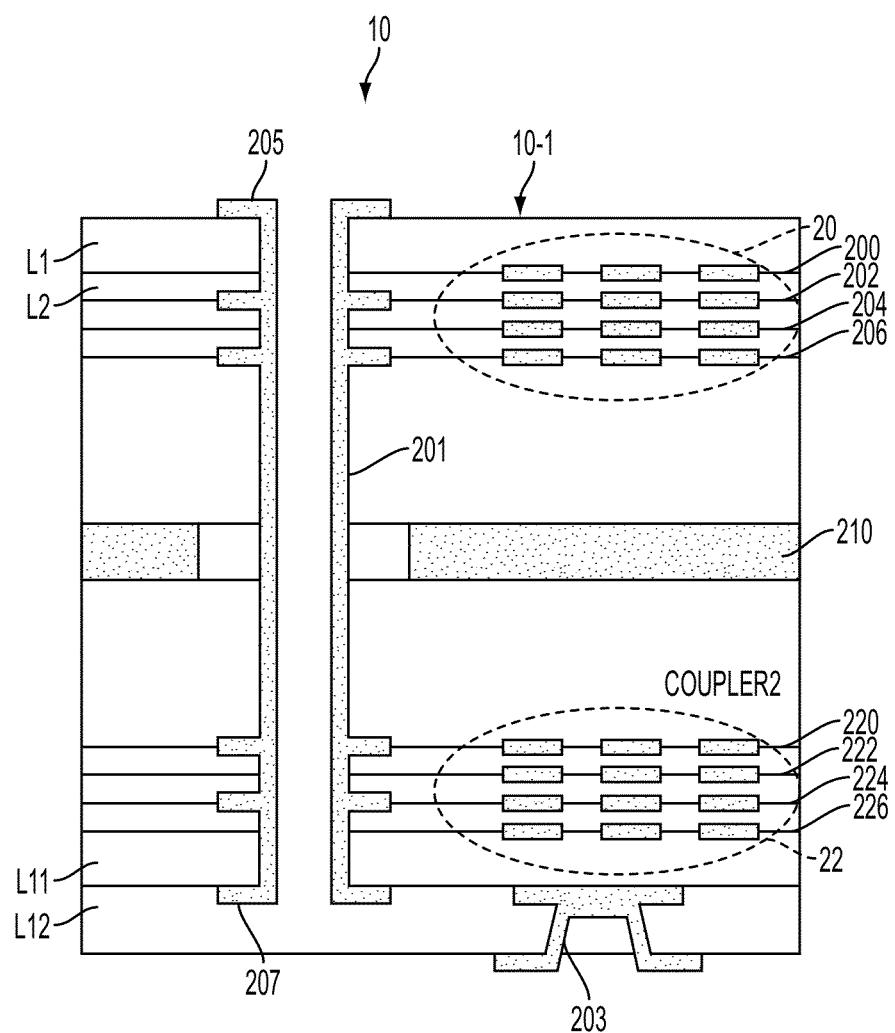
FIG. 7 is a cross-sectional diagram of the broad band impedance transformer integrated circuit depicted in FIG. 2.

As embodied herein and depicted in FIG. 7, a cross-sectional diagram of the broad band impedance transformer integrated circuit 10 depicted in FIGS. 2 and 5 is disclosed. Coupler 20 is shown to include four vertically aligned and inter-digitally connected copper layers 200-206. These layers are disposed above the center ground layer 210. Coupler 22 includes four vertically aligned and inter-digitally connected copper layers 220-226; and these layers are disposed below the center ground layer 210. The interconnections provided by the present invention reduce the linewidth for the required odd mode impedance while, at the same time, increases the even mode impedance of the coupler. As shown below, these layers 200-206 and 220-226 are configured in a spiral pattern to further increase the even mode impedance without impacting the coupler's odd mode impedance.

As those skilled in the art will appreciate, vias 201 are drilled through layers L1 to L11 to make the necessary connections between the various copper layers. Layers L1 and L11 include connection pads 205, 207 for the vias 201 in order to provide reliable interconnections. Layer L12 provides the "bottom footprint" for the standard SMT 0805 package. The vias 203 are drilled through layers L11 and L12 to provide the I/O pins and ground pins as needed.

Figure 8A:
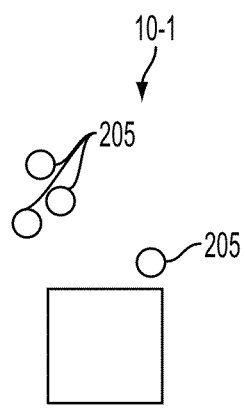
FIGS. 8A-8N are plan views of the trace layouts for each layer of the integrated circuit device depicted in FIG. 7.
Figure 8B:
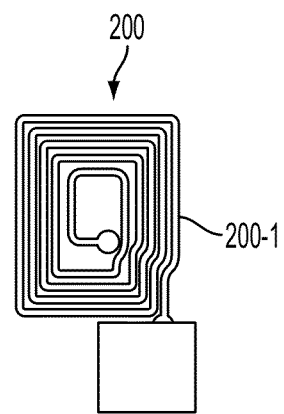
Figure 8C:
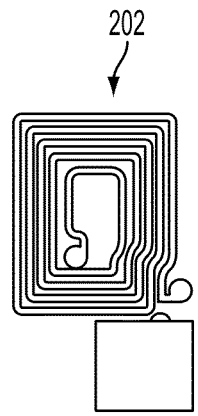
Figure 8D:
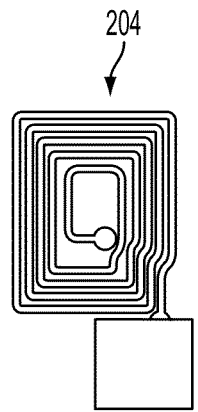
Figure 8E:
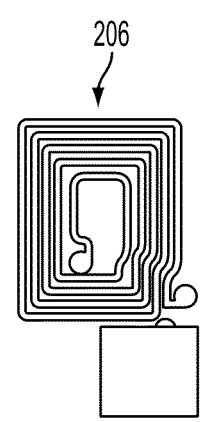
Figure 8F:
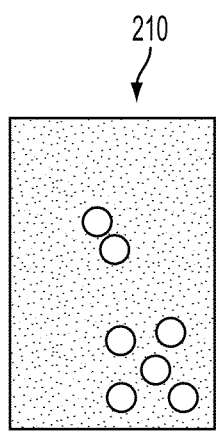
Figure 8G:
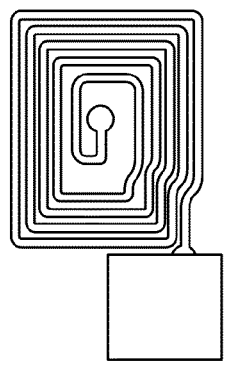
Figure 8H:
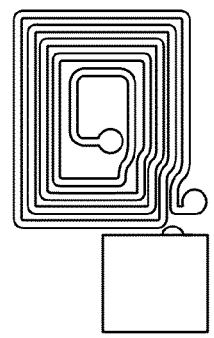
Figure 8I:
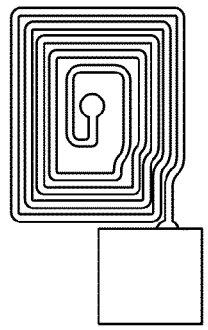
Figure 8J:
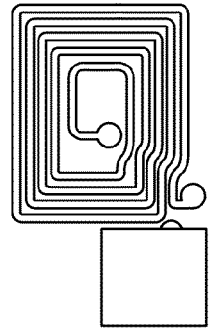
Figure 8K:
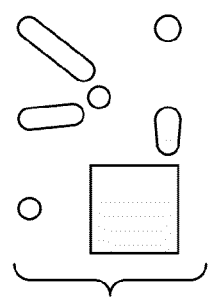
Figure 8L:
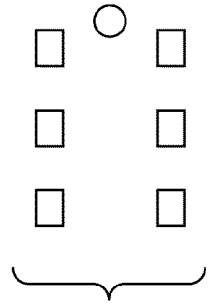
Figure 8M:
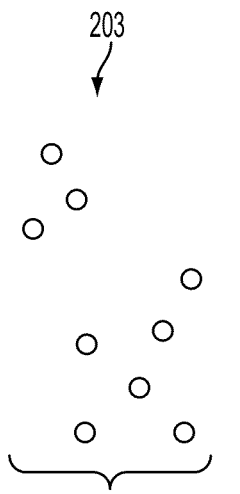
Figure 8N:
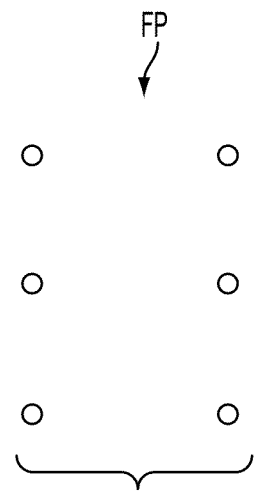

Referring to FIGS. 8A-8N, plan views of the trace layouts for each layer of the device depicted in FIG. 7 are disclosed. FIG. 8A shows the top via landing pads 205 in plan view. FIGS. 8B-8E show the spiral layouts 200-1 for each of the layers 200-206 forming coupler 20. FIG. 8F shows the middle ground plane in the inter-digital structure. FIGS. 8G-8J show the spiral layouts for each of the layers 220-226 forming the coupler 22.

Finally, FIGS. 8K-8N show the various interconnective layers and vias required to realize the broadband impedance transformer 10 in the standard SMT 0805 IC package.

Figure 9A:
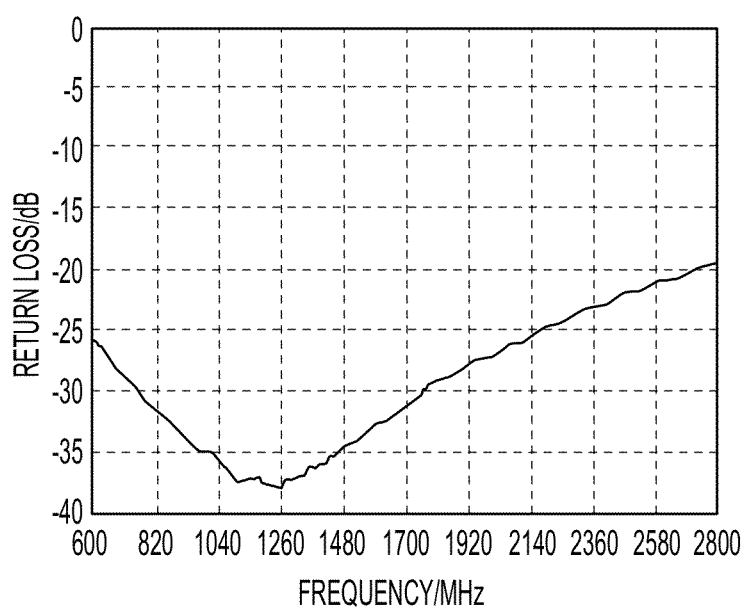
FIGS. 9A-9C are charts illustrating the return loss and insertion loss of the integrated circuit device of the present invention.
Figure 9B:
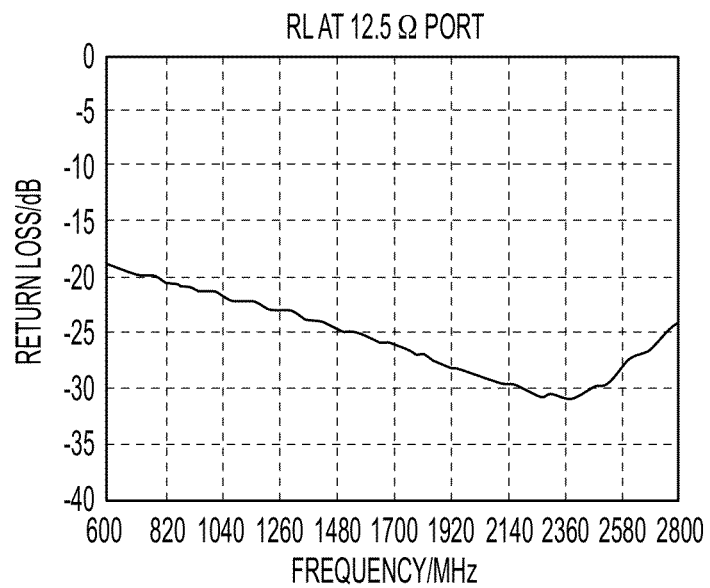
Figure 9C:
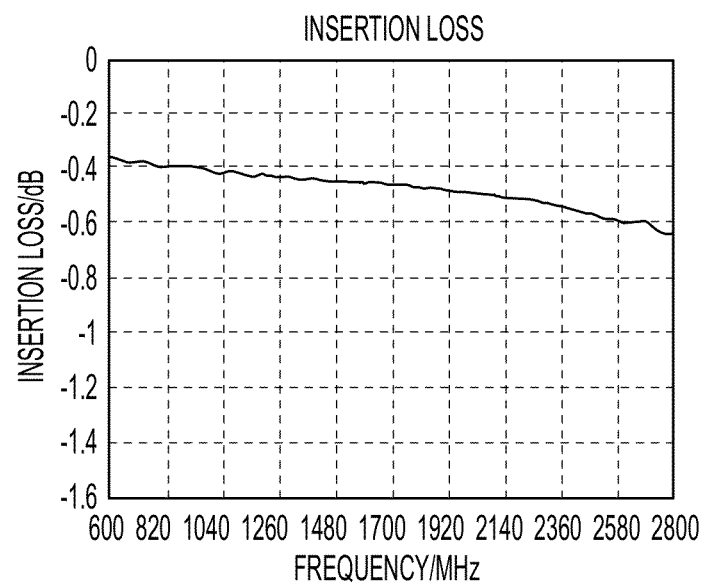

In reference to FIGS. 9A-9C, various charts illustrating the return loss and insertion loss of the integrated circuit device of the present invention are disclosed. In FIG. 9A, a plot is provided that shows the measured return loss (dB) at the 50 ohm port 14 versus the operating frequency (MHz) of the device 10. FIG. 9B shows the measured return loss (dB) at the 12.5 ohm port 12 versus the operating frequency (MHz) of device 10. FIG. 9C shows the measured insertion loss (dB) versus frequency (MHz) for device 10. The low band cutoff frequency of −20 dB RL is determined by the even mode impedance of the coupler for a fixed length of coupler. The higher the even mode impedance, the wider the bandwidth is. Table I shows that the relative bandwidth with respect to even mode impedances for couplers having the same length.

TABLE 1

| | Even mode impedance | | | | | |
|---|---|---|---|---|---|---|
| | 200 ohm | 225 ohm | 250 ohm | 275 ohm | 300 ohm | 360 ohm |
| Relative Bandwidth | 78% | 143% | 148% | 152% | 155% | 160% |

The results show that the spiral layout and the vertically coupled interdigital transmission lines achieve the required high even mode impedances in a planer structure without the use of any ferrite components.

Figure 10:
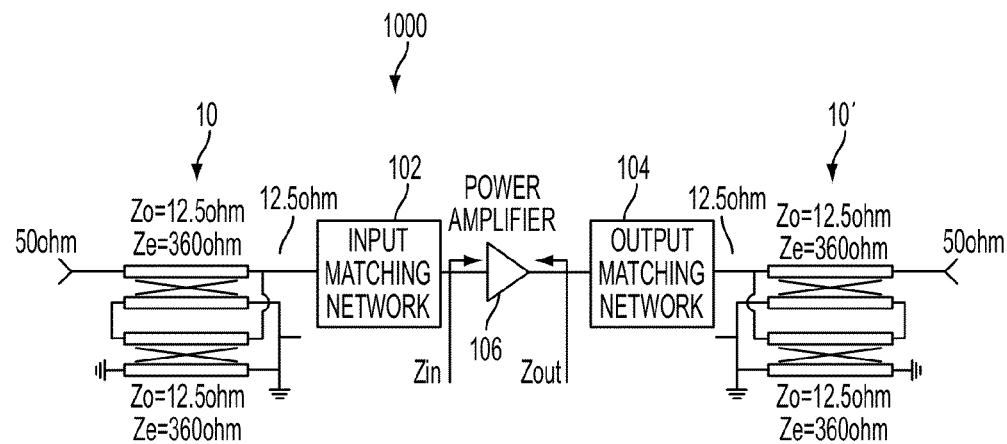
FIG. 10 is diagrammatic depiction of a power amplifier arrangement in accordance with the present invention.

As embodied herein and depicted in FIG. 10, a diagrammatic depiction of a power amplifier arrangement in accordance with the present invention is disclosed. Note that the optimum input matching impedance of a high power transistor is often quite low relative to a typical 50 ohm (or 75 ohm) system impedance. Thus, impedance transformer 10 of the present invention is disposed in the arrangement of FIG. 10 before input impedance matching network 102, which is then coupled to the power amplifier 106. Accordingly, the impedance transformer 10 of the present invention allows the input matching network 102 of the power amplifier 106 to meet a less stringent requirement in that it need only impedance match to 12.5 ohm (instead of directly to a 50 ohm system impedance).

The same is true for the output impedance of the power amplifier 106. Note that the output of the power amplifier 106 is coupled to an output impedance matching network 104, which is, in turn, coupled to the impedance transformer 10' of the present invention. In this case, impedance transformer 10' of the present invention allows the output matching network 104 of the power amplifier 106 to meet a less stringent requirement in that it need only impedance match to 12.5 ohm since impedance transformer 10' transforms the impedance from 12.5 ohms to the 50 ohm system impedance.

Figure 11:
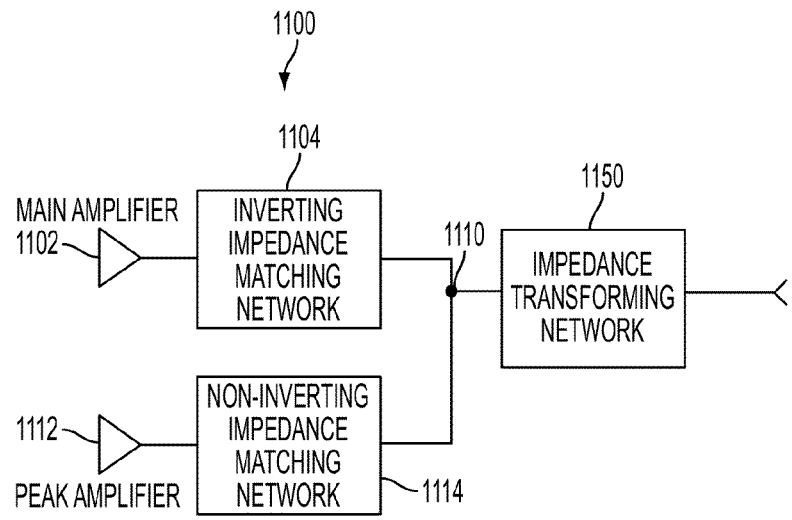
FIG. 11 is a general diagram of a Doherty power amplifier.

In reference to FIG. 11, a diagram of a Doherty power amplifier in shown since impedance matching for Doherty power amplifiers is another important application of the present invention. The Doherty amplifier 1100 is balanced arrangement that includes a main amplifier 1102 disposed in parallel with a peak amplifier 1112. In other words, quadrature input signals are amplified by the main and peak amplifiers (1102,1112). The main amplifier is coupled to an inverting impedance matching network 1104 whereas the peak amplifier is connected to a non-inverting impedance matching network 1114; and therefore, the inverting and non-inverting matching networks 1104, 1114 are the amplifiers' (1102, 1112) output matching network. At maximum power mode, the signals amplified by main and peak amplifiers are combined at a summing node 1110 and traverse the impedance matching network 1150.

The Doherty amplifier 1100 operates in a "back-off" mode when the peak amplifier 1112 is OFF and presents a high output impedance. The non-inverting impedance matching network 1114 transforms the peak amplifier path to high impedance at the combining node 1110. And the same time, the inverting impedance matching network 1104 performs the load modulation and supplies the main amplifier 1102 with the high impedance load that is required by Doherty operation to thereby enhance the operational efficiency.

The bandwidth can be improved in the Doherty amplifier 1100 by providing an inverting impedance matching network and non-inverting impedance matching network that feature low impedance transforming ratios. However, the burden of providing the required impedance transforming ratio is shifted to output impedance transforming matching network 1150 after the combining node 1110. Accordingly, the impedance transformer 10 of the present invention is well suited to provide the requisite wideband impedance matching, while at the same time, being disposed in a miniaturized form factor and exhibiting a low insertion loss.

Figure 12:
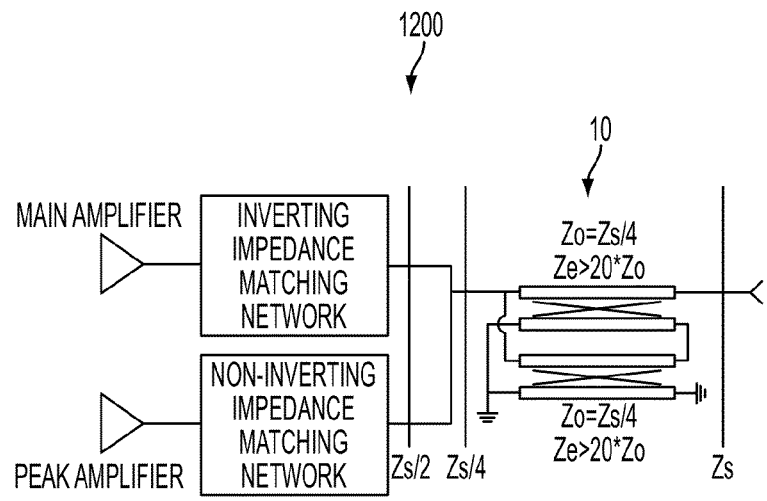
FIG. 12 is a schematic diagram of an impedance transformer employed in a Doherty Amplifier in accordance with an embodiment of the present invention.

In reference to FIG. 12, a schematic diagram of an impedance transformer 10 employed in a Doherty Amplifier 1200 in accordance with another embodiment of the present invention is disclosed. As described previously, the impedance transformer 10 is configured to transform the impedance of Zs/4 (at the combining node) to the system impedance Zs at the amplifier output.

Figure 13:
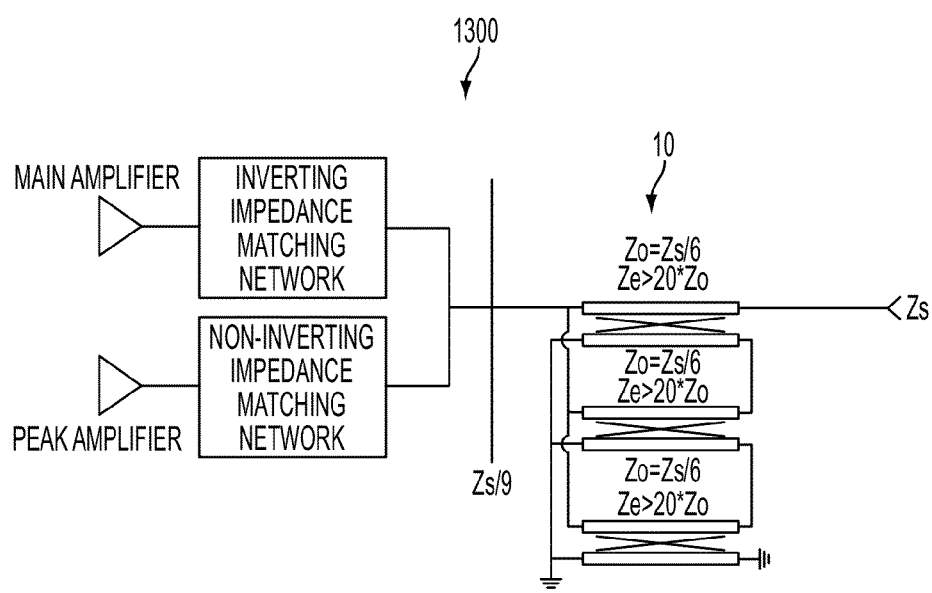
FIG. 13 is a schematic diagram of an impedance transformer employed in a Doherty Amplifier in accordance with another embodiment of the present invention.

Referring to FIG. 13, a schematic diagram of an impedance transformer 10 employed in a Doherty Amplifier in accordance with another embodiment of the present invention. The impedance transformer 10 described in conjunction with FIG. 5 provides a transforming ratio of 1:9 and is well suited for Doherty Amplifier 1300.

Figure 14:
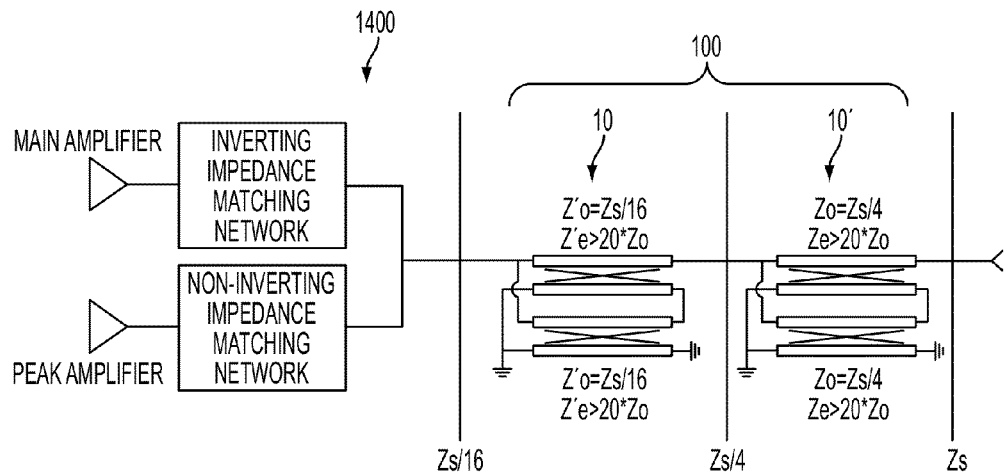
FIG. 14 is a schematic diagram of a cascaded impedance transformer employed in a Doherty Amplifier in accordance with yet another embodiment of the present invention.

In reference to FIG. 14, a schematic diagram of a cascaded impedance transformer employed in a Doherty Amplifier in accordance with yet another embodiment of the present invention is disclosed. Here, two couplers 10 and 10' of the present invention are cascaded to provide a larger impedance transforming ratio. In this example embodiment, the impedance of Zs/16 at combining node is transformed to the system impedance Zs by the two-stage impedance transformer 100. Note that the first impedance transformer 10 is configured with an odd-mode impedance of Zs/16. The second stage impedance transformer 10' has an odd mode impedance of Zs/4.

Figure 15:
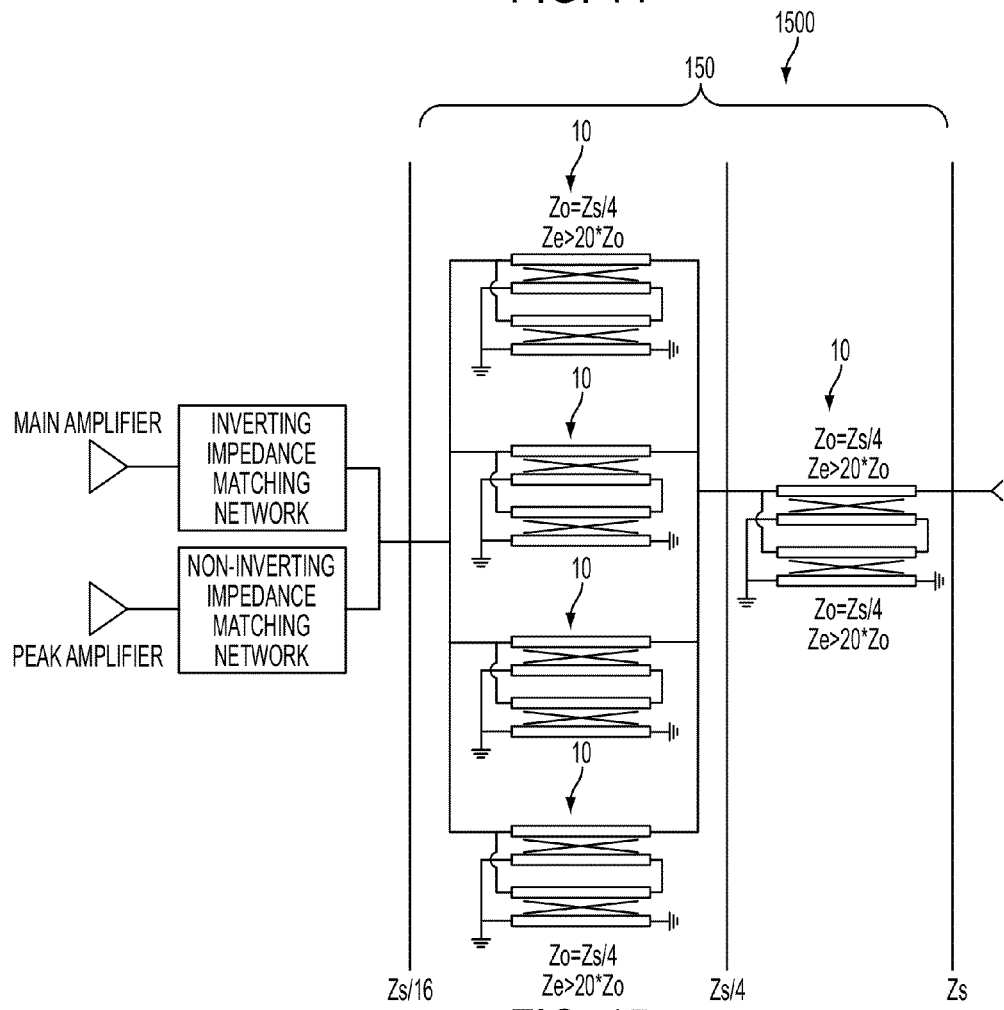
FIG. 15 is a schematic diagram of a cascaded impedance transformer employed in a Doherty Amplifier in accordance with yet another embodiment of the present invention.

Referring to FIG. 15, a schematic diagram of another cascaded impedance transformer 150 employed in a Doherty Amplifier 1500 in accordance with yet another embodiment of the present invention is disclosed. This embodiment employs five (5) identical couplers 10 to again implement an impedance ratio of 16. This may be convenient in that the five couplers 10 have the same even and odd mode impedances.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions and equivalents falling within the spirit and scope of the invention, as defined in the appended claims. Thus, it is intended that the present invention cover the modifications and variations of this invention provided they come within the scope of the appended claims and their equivalents.

What is claimed is:

1. An impedance transformation device for use in a system having a characteristic system impedance, the device being characterized by a predetermined bandwidth having a center frequency, the device comprising:

a housing including an interior region characterized by a size substantially corresponding to a one-eighth wavelength of the center frequency, the housing including a plurality of input/output (I/O) ports, the plurality of I/O ports including a first port configured to be coupled to a system component characterized by a component port impedance, and a second port configured to be coupled to the system impedance, an impedance transformation ratio of the component port impedance and the system impedance;

a first coupler disposed in the interior region and including a first transmission line and a second transmission line, first transmission line being coupled between the first port and the second port, the first transmission line and the second transmission line having a predetermined geometry disposed in a stripline broadside arrangement, the first coupler being characterized by an even mode impedance and an odd mode impedance, the bandwidth being a function of the even mode impedance and the odd mode impedance substantially corresponding to the component port impedance; and at least one second coupler disposed in the interior region substantially in parallel with the first coupler, the at least one second coupler including a third transmission line and a fourth transmission line having the predetermined geometry disposed in the stripline broadside arrangement, the at least one second coupler being characterized by the even mode impedance and the odd mode impedance.

2. The device of claim 1, wherein the predetermined geometry includes a spiral transmission line arrangement.

3. The device of claim 1 wherein the stripline broadside arrangement includes four vertically aligned and interdigitally connected transmission lines.

4. The device of claim 1, further comprising a ground plane disposed between the first coupler and the at least one second coupler, the first coupler including two or more transmission lines vertically aligned and interdigitally connected and the at least one second coupler including two or more transmission lines vertically aligned and interdigitally connected.

5. The device of claim 1, wherein the housing includes an integrated circuit package configured to be disposed on a printed circuit board.

6. The device of claim 1, wherein the odd mode impedance is substantially equal to one fourth the system impedance.

7. The device of claim 6, wherein the impedance transformation ratio is substantially equal to one fourth the system impedance.

8. The device of claim 1, wherein the odd mode impedance is substantially equal to one sixth the system impedance.

9. The device of claim 8, wherein the impedance transformation ratio is substantially equal to one ninth the system impedance.

10. The device of claim 1, wherein the system includes a Doherty amplifier arrangement, the first port being coupled to a Doherty summation node, the Doherty summation node being configured to combine signals provided by a main amplifier inverting impedance matching network and a peak amplifier non-inverting impedance matching network.

11. The device of claim 10, wherein the impedance transformation ratio is selected from a group of impedance transformation ratios including one-fourth, one-ninth, and one-sixteenth.

12. The device of claim 1, wherein a first end portion of the first transmission line and a first end portion of the at least one third transmission line are coupled in parallel to the first port.

13. The device of claim 12, wherein a second end portion of the second transmission line is coupled in series with a second end portion of the at least one third transmission line.

14. The system of claim 12, wherein a first end of the second transmission line and a first end of the at least one fourth transmission line are coupled to a ground potential.

15. A Doherty amplifier system for use with the device of claim 1, the system comprising:
- a main amplifier coupled to a summation node via an inverting impedance matching network, a peak amplifier coupled to the summation node via a non-inverting impedance matching network;
- an impedance transformation network coupled between the summation node and the system impedance, the impedance transformation network including a plurality of impedance transformation devices of claim 1.

16. The system of claim 15, wherein the impedance transformation network includes a first impedance transformation network coupled in series with a second impedance transformation network, each of the first impedance transformation network and the second impedance transformation network including at least one device of claim 1.

17. The system of claim 16, wherein the first impedance transformation network includes four devices of claim 1, the first transmission line of each of the four devices of claim 1 being connected in parallel.

18. The system of claim 16, wherein the impedance transformation ratio is substantially equal to about one-sixteenth.

19. The device of claim 1, wherein the at least one second coupler includes a second coupler substantially in parallel with a third coupler.

20. The device of claim 19, wherein the system includes a Doherty amplifier arrangement, the first port being coupled to a Doherty summation node, the Doherty summation node being configured to combine signals provided by a main amplifier inverting impedance matching network and a peak amplifier non-inverting impedance matching network.

21. The device of claim 19, wherein the second coupler includes a third transmission line and a fourth transmission line and is characterized by the even mode impedance and the odd mode impedance, and wherein the third coupler includes a fifth transmission line and a sixth transmission line and is characterized by the even mode impedance and the odd mode impedance.

22. The device of claim 21, wherein a first end of the second transmission line, a first end of the fourth transmission line, and a first end of the sixth transmission line are coupled to a ground potential.

23. The device of claim 21, wherein a first end portion of the first transmission line, a first end portion of the third transmission line and a first end portion of the fifth transmission line are coupled in parallel to the first port.

24. The device of claim 23, wherein a second end portion of the second transmission line is coupled in series with a second end of the third transmission line, and wherein a second end portion of the fourth transmission line is coupled in series with a second end of the fifth transmission line.

25. The device of claim 1, wherein the system includes a power amplifier having an input impedance and an output impedance.

26. The device of claim 25, wherein the first port is coupled to an output matching network disposed between the second port and the power amplifier output impedance.

27. The device of claim 25, wherein the first port is coupled to an input matching network disposed between the second port and the power amplifier input impedance.

28. The device of claim 27, wherein the impedance transformation ratio is substantially equal to about one-fourth.

29. The device of claim 27, wherein the impedance transformation ratio is substantially equal to about one-fourth.

* * * * *